Figure 1:
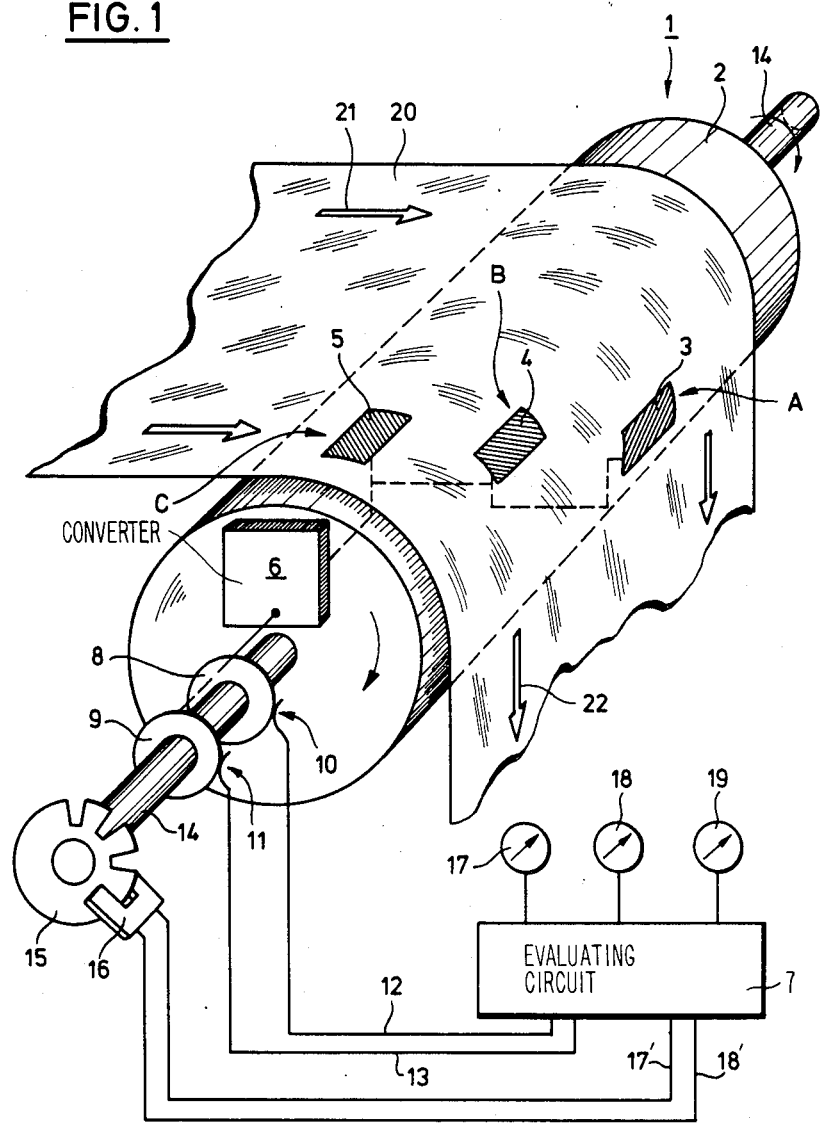

United States Patent [19]

Thorn

[11] Patent Number: 4,682,105
[45] Date of Patent: Jul. 21, 1987

[54] APPARATUS FOR ELECTRICALLY CONTACTLESSLY MEASURING THE THICKNESS OF ELECTRICALLY CONDUCTING THIN FILMS ON NON-CONDUCTING TRAVELLING WEBS IN VACUUM DEPOSITION APPARATUS

[75] Inventor: Gernot Thorn, Hanau am Main, Fed. Rep. of Germany

[73] Assignee: Leybold-Heraeus GmbH, Cologne, Fed. Rep. of Germany

[21] Appl. No.: 654,762

[22] Filed: Sep. 25, 1984

[30] Foreign Application Priority Data

Oct. 1, 1983 [DE] Fed. Rep. of Germany ....... 3335766

[51] Int. Cl.$^4$ ............ G01B 7/08; G01B 7/10; G01R 33/12
[52] U.S. Cl. .................... 324/230; 73/159; 324/61 R; 427/10
[58] Field of Search ............ 324/228–232, 324/206, 243, 61 R, 61 P; 340/675, 676; 427/9, 10; 73/159

[56] References Cited

U.S. PATENT DOCUMENTS

| | | | |
|---|---|---|---|
| 2,703,384 | 1/1955 | Rendel | 324/230 |
| 3,037,163 | 5/1962 | Wiprud | 324/61 R |
| 3,258,686 | 6/1966 | Selgin | 324/230 |
| 3,704,412 | 11/1972 | Lundstrom | 324/61 R |
| 3,823,371 | 7/1974 | Lippke | 324/61 R X |
| 3,949,856 | 4/1976 | Ulber et al. | 340/675 X |
| 4,356,714 | 11/1982 | Quehen | 73/159 X |

FOREIGN PATENT DOCUMENTS

| | | |
|---|---|---|
| 1813333 | 6/1970 | Fed. Rep. of Germany . |
| 2345849 | 3/1975 | Fed. Rep. of Germany . |
| 3330092 | 3/1985 | Fed. Rep. of Germany . |
| 606102 | 8/1948 | United Kingdom . |
| 0928500 | 6/1963 | United Kingdom . |
| 1055911 | 1/1967 | United Kingdom . |
| 1186513 | 4/1970 | United Kingdom . |
| 1257306 | 12/1971 | United Kingdom . |
| 1378505 | 12/1974 | United Kingdom . |
| 1452417 | 10/1976 | United Kingdom . |
| 2145543 | 3/1985 | United Kingdom . |

*Primary Examiner*—Gerard R. Strecker
*Attorney, Agent, or Firm*—Felfe & Lynch

[57] ABSTRACT

Arrangement for electrically measuring coating thickness on travelling webs in vacuum deposition apparatus. A plurality of sensors are arranged with respect to a roller around which the web runs each with a spatially limited measuring region. These produce signals which represent a measure for the coating thickness. The signals can be indicated by an evaluating circuit. To avoid a falsification of the measuring signals as a result of the tendency of the travelling web to flutter, according to the invention the sensors (3,4,5) are arranged in the roller (1) against its surface and are distributed lengthwise of the roller. The sensors are connected to the evaluating circuit (7) by a transfer device (28). Preferably, the sensors rotate with the roller.

4 Claims, 4 Drawing Figures

APPARATUS FOR ELECTRICALLY CONTACTLESSLY MEASURING THE THICKNESS OF ELECTRICALLY CONDUCTING THIN FILMS ON NON-CONDUCTING TRAVELLING WEBS IN VACUUM DEPOSITION APPARATUS

The invention relates to an arrangement for electrically measuring coating layers on travelling webs in vacuum deposition apparatus having at least one roller around which the web runs, a plurality of sensors with spatially limited measuring regions, for signals which represent a measure for the coating thickness, and an evaluation circuit for the measurement signals.

Such an arrangement serves principally also for controlling the coating thickness in the production of coatings, whether by vacuum vaporization or cathode sputtering. The coating thickness has as a rule a substantial effect on the properties of the end product, namely the coated films. This goes for condenser foils with aluminum coatings as well as for magnetic recording media, or films, in which the optical properties play a decisive role.

The electrical measurement of coating thickness is an indirect measurement, as in reality it is the electrical resistance that is measured. This is, however, completely representative of the coating thickness, and in numerous cases the surface resistance is even quoted as a nominal value.

The measurement of the surface resistance on travelling webs is problematical, as a sliding mechanical contact is precluded. Even rolling contacts are difficult to handle on account of the contact resistance. So only contactless measuring methods can be considered.

It is known from DE-OS No. 1813333 to run webs with electrically conductive coatings either over two metallic rollers or over one roller with two metallic end pieces which are separated electrically from each other by an insulating member. As the electrically conductive coating is on the side of the film remote from the rollers, a kind of condenser is formed which couples the coating capacitively to a measuring ring. The measuring current can be transmitted through corresponding contacts on the rollers, and serves as a measure for the surface resistance of the coating. Although thickness variations of the insulating material web, which could introduce error into the results, can be compensated by a reference arm of a bridge circuit, it is only possible with the known method to determine the integrated surface resistance over the whole breadth of the web, so that variations in the coating thickness transverse to the direction of travel of the web cannot be determined if they balance out in total. Such coating thickness variations might be manifest for example as "stripiness"; they appear especially when the source of the coating material comprises several individual sources, which must be all controlled independently of each other. Such a control arrangement requires an individual sensor for each source of the coating material, which measures the coating produced by that source. The known integrated measurement cannot be used for such a process control.

There is also known from DE-OS No. 2345849 a contactless measuring method for coating thickness on travelling webs with which spatially limited measuring regions can be determined. The measurement is effected inductively, and to compensate for a tendency of the travelling web to flutter, which is practically unavoidable without running the web around a roller, two induction coils are provided lying on different sides of the web. By adding the output signals of the two coils there can be produced a linear region between the measuring coils in which a change in position of the travelling web has no negative effect on the measured result. With such apparatus, however, only measurements in the edge regions of travelling webs can be carried out at justifiable cost, because measurements in the middle of the web, with wide webs, would need a fork-like measuring device which guarantees a constant spacing between the two induction coils. Even small variations in the coil spacing would lead to an error in the measuring result and it has proved practically impossible to make a fork-like support for the induction coils sufficiently rigid. A further disadvantage is that, with a plurality of such sensors, space problems arise, and it is especially difficult when loading the apparatus with a fresh film, to guide the film between all of the fork-like sensor supports.

The invention is based on the problem of producing a measuring arrangement for determining a coating thickness profile in the widthwise direction of the web, in which a plurality of sensors are arranged on only one side of the web and in which nevertheless a web movement in the direction perpendicular to the web surface in the region of the sensors is suppressed.

The solution to the stated problem is produced, according to the invention, in the measuring arrangement described above in which the sensors are arranged in the roller on its surface and distributed lengthwise of the roller, and by a transfer device connected to the evaluating circuit.

In the sensor arrangement according to the invention, use is made of the fact that the travelling web is not subject to flutter in the region where it contacts the roller, so that with a constant web thickness there is also a constant spacing between the electrically conducting layer and the respective sensor. Any variations in film thickness are easily compensatable by variations in the capacitive measurement in the manner described above. The respective sensors, on the basis of their working principle to be explained in more detail below, see only a spatially limited surface region, so that by a correspondingly dense arrangement of the sensors a sufficiently accurate detection of the profile of the coating thickness can be effected. As web coating apparatus is already equipped with a large number of rollers, putting the sensors in one of these rollers requires little extra space and the threading in or insertion of a new film brings no kind of difficulty. Through the arrangement according to the invention a corresponding number of sources of coating material can be arranged in a narrow space, so that an unusually good homogeneity of direction of travel of the web can be achieved. In order to get a quantitative impression of the effectiveness of the invention with regard to the prior art it is noted as follows: In an induction coil arranged on one side, the field strength falls substantially as the third power of the probe-coating spacing, so that with a spacing of only one millimeter and a superimposed transverse motion of the web of $\pm 0.1$ mm there is already an error of about 30%. By the arrangement of two induction coils on opposite sides of the web according to DE-OS No. 2345849 there is only an error of about 5% in a zone which extends some 40% of the width of the air space between the two induction coils. Such an improvement is at all events only to be achieved with a substantial cost of construction and with a more difficult operation of the web coating apparatus. In the solution according to the invention, despite a substantially simpler method of construction, there is a maximum error of only 1%, which can be tolerated for most purposes.

It is thereby possible to arrange for the sensors to be stationary and for example to divide up the roller lengthwise and to arrange sensors between the roller sections. It is also possible to form the roller with an extremely thin wall and to arrange the sensors stationary within this hollow roller. Such a measure however requires special materials for the cover of the roller; otherwise the sensors are considerably spaced apart from the coating to be measured.

It is therefore particularly advantageous to arrange the sensors in the roller in such manner that their operative surfaces lie directly in the roller surface and that the sensors rotate with the roller.

In this last-mentioned case, the sensors only come intermittently into contact with the support material of the web on the side opposite the coating, the relevant path length being proportional to the wrap angle of the web on the roller. For the measurement, as a result of this, only that time is selected in which during which the relevant probe and the surface portion of the coating to be measured are on concentric circles or lie on concentric cylindrical surfaces. This is easily effected by a corresponding electrical control or on the known commutator principle. For the case that all sensors are arranged along a single surface generator of the roller, each sensor can be provided with its own conductor, for example its own slip ring for making a contact.

It is however particularly advantageous for the savings in transfer means, if the sensors, as shown in the examples, are arranged in echelon in the peripheral direction and connectible to the evaluation circuit one after another in dependence on the instantaneous roller position.

Figure 2:
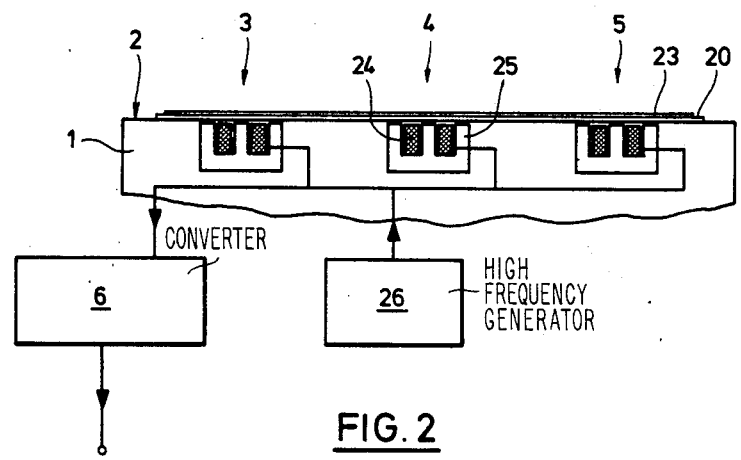
Figure 3:
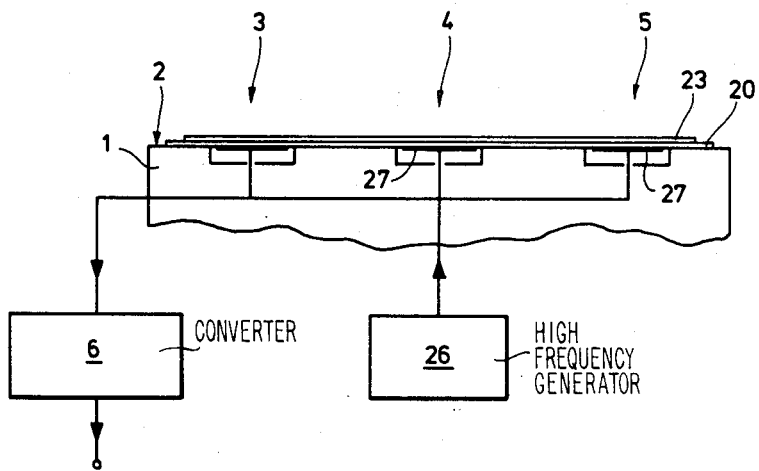
Figure 4:
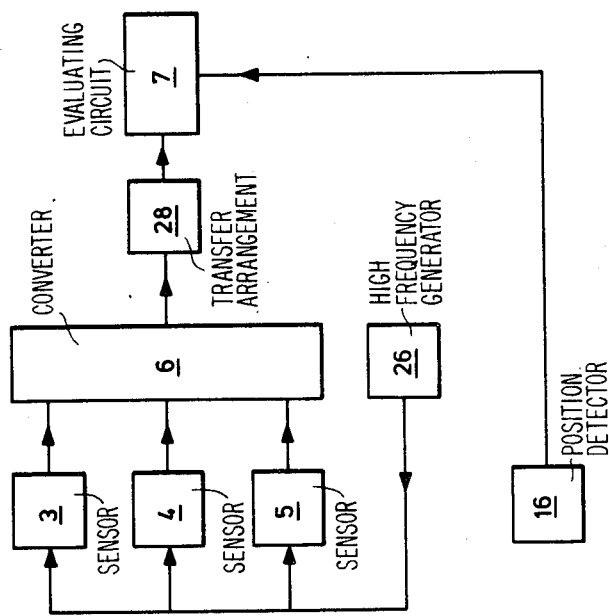

One embodiment of the invention and its evaluation circuit as well as two different sensor systems will be explained in more detail with reference to FIGS. 1 to 4, in which:

FIG. 1 is a perspective representation of a roller with three sensors and a travelling web on the roller in conjunction with an evaluating circuit, FIG. 2. shows a series of sensors, which comprise induction coils, shows a series of sensors which FIG. 3 shows a series of sensors which comprise condenser plates, and FIG. 4 is a block diagram for the acquisition and processing of sensor signals.

FIG. 1 shows a roller which is of hollow construction and has a cylindrical cover 2. In this cover are apertures at positions A, B and C in which sensors 3, 4 and 5 are arranged, of which details will be further explained with reference to FIGS. 2 and 3. The sensors rotate with the roller 1. Leads run from them to a converter 6 in which the measurement signals are converted into such signals as are transmittable to an evaluating circuit 7. In the present case the converter 6 produces electrical signals which are proportional to the measured values and are fed to two slip rings 8 and 9. These are in contact with brushes 10 and 11 from which the potential is fed to the evaluating circuit 7 by leads 12 and 13.

The roller 1 has a shaft 14 on which it is supported in bearings not shown. At the forward end of the shaft 14 is a position indicator 15 for the angular position of the shaft 14, which co-operates with a position detector 16. Such devices are known; they can for example work magnetically and transmit the position signal through leads 17' and 18' also to the evaluating circuit 7. In this manner it is possible to take the individual measurement values in sequence and only from a limited space, i.e. within a given angle of rotation of the roller 1. The evaluating circuit 7 assigns the measured values to indicators 17, 18 and 19, which correspond positionally to the individual sensors 3, 4 and 5.

Instead of a galvanic transmission of the measuring signals, a contactless telemetric transmission can be used for example by radio signals, if the converter 6 has a suitable transmitter. The evaluating circuit 7 is then equipped with a corresponding receiver. It is also possible to fit out each of the sensors 3, 4 and 5 with its own transmitter inside the converter 6.

An already coated web 20 is guided around the roller 1 on its outer surface, which web meets the roller in the direction of the arrow 21 horizontally and is drawn off vertically in the direction of arrow 22. The angle of wrap therefore amounts to 90°.

The roller 1 is one of numerous similar rollers comprised in a transport system for the travelling web 20, which, however, like the supply and wind-up rollers, are not illustrated. The whole arrangement is comprised in a vacuum chamber, also not shown, in which the source for the coating material is accommodated. An evaporator or a cathode vaporizer can be operated in connection with this source.

FIG. 2 shows a partial axial section through the roller 1 with the sensors 3, 4 and 5. The web 20 lying on the cylindrical cover 2 is shown in cross section as is the coating 23 on it, however to a substantially larger scale. The sensors in the present case are formed from induction coils 24 which are fitted into armatures 25. The pole faces of these armatures are directed towards the web 20 and the coating 23. The induction coils 24 are fed from a high frequency generator 26. The inductive properties of the induction coils 24 and the armatures 25, that is to say the sensors will be determined according to the measure of the resistance of the coating or the thickness of the coating 23 and this determination will be fed to the converter 6 in the form of a measuring signal, the output signal of which converter being fed further to the evaluating circuit 7.

FIG. 3 shows a variant of the apparatus of FIG. 2. In this case, the sensors 3, 4 and 5 comprise condenser plates 27, which lie directly in the surface of the cylindrical cover 2, that is to say, they have a common cylindrical surface therewith, in which, however, provision is made for suitable electrical insulation. The condenser plates 27 are also fed from a high frequency generator 26 and from individual condensers with the electrically conductive coating 23, of which condensers the dielectric comprises the material of the web 20, as a rule, therefore, a thermoplastic material. The potential of the arrangement thus formed will likewise be determined by the surface resistance of the portion of coating lying above the condenser plates and this determination is fed as a measuring signal to the converter 6 which feeds it on to the evaluating circuit 7.

The inductively operating probes of FIG. 2 are preferred for thicker layers. The measuring region extends according to the output frequency of the high frequency generator 26 from the order of nanometers to the order of millimeters of coating thickness, corresponding to surface resistances from about 50 ohm/sq meter up to a few milliohms/sq. meter. The capacitance probes of FIG. 3 are particularly suitable for very thin i.e. high resistance coatings. The measuring region extends according to the chosen frequency of the high frequency generator 26 from about 10 ohms/sq. meter up to the megohm/sq. meter range.

FIG. 4 shows the sensors 3, 4 and 5 connected to the converter 6, a transfer arrangement 28 and the evaluating circuit 7 in block diagram form. The transfer arrangement 28 can as shown in FIG. 1 be formed of slip rings and brushes 8/10 and 9/11 respectively.

The illustrated apparatus operates as follows:

The sensors 3, 4 and 5 are arranged in echelon in the circumferential direction and the sensor 3 first comes into contact with the web 20 (film) and runs with it around an angle of 90°. Next the sensor 4 and finally the sensor 5 comes into contact with the web 20, whereby the determination of the measured value is effected over only a part of the path in which the sensors and the web 20 move in concentric circles and lie on concentric cylindrical surfaces. The corresponding positions of the sensors is determined by the position indicator 15 and the position detector 16.

Corresponding to the number of sensors the web 20 can be divided into individual sections transversely to the transport direction (arrows 21 and 22), of which the coating thickness can be selectively determined. In this way it is possible to measure each individual "strip" of the web 20 separately and by means of the measuring signal in comparison with corresponding nominal values to effect an individual control of the corresponding coating sources. A control process, for which the arrangement of FIG. 1 can be used, is for example the subject of DE-OS No. 3330092.

I claim:

1. Apparatus for electrically contactlessly measuring the thickness of electrically conducting thin films on non-conducting travelling webs in vacuum deposition apparatus comprising: at least one roller around which the webs runs, a plurality of individual sensors each with a circumferentially spatially limited measuring region with respect to the circumference of said roller for developing measurement signals which represent a measure for the film thickness, an evaluating circuit for the measurement signals, a converter for coupling said sensors in common to said evaluating circuit, in which measuring apparatus the sensors are arranged in the roller against its surface and are distributed lengthwise of the roller to rotate with the said roller and are coupled to the evaluating circuit, said roller having at least one position indicator for indicating the position of the sensors during the time in which the respective sensor and the web move in concentric circles, and said evaluating circuit having means coupled to said at least one position indicator for receiving from said position indicator a position signal for each sensor and for evaluating the measurement signal in response to its respective position signal only for a defined angle of rotation in which the respective sensor and the web move in concentric circles.

2. Apparatus in accordance with claim 1, in which said converter includes a transfer device and in which the sensors are coupled to the evaluating circuit by the transfer device.

3. Apparatus in accordance with claim 1, in which the sensors are arranged to rotate with the roller.

4. Apparatus in accordance with claim 3, in which the sensors are arranged in echelon in the circumferential direction and are coupled to the evaluating circuit one after the other in dependence on the instantaneous position of the roller.

* * * * *